(12) United States Patent
Jeong et al.

(10) Patent No.: US 12,165,719 B2
(45) Date of Patent: Dec. 10, 2024

(54) STATIC RANDOM ACCESS MEMORY APPARATUS THAT MAINTAINS STABLE WRITE PERFORMANCE IN LOW POWER ENVIRONMENT

(71) Applicant: Kwangwoon University Industry-Academic Collaboration Foundation, Seoul (KR)

(72) Inventors: Hanwool Jeong, Seoul (KR); Jaehyun Park, Seoul (KR); Sangheon Lee, Seoul (KR)

(73) Assignee: Kwangwoon University Industry-Academic Collaboration Foundation, Seoul (KR)

( * ) Notice: Subject to any disclaimer, the term of this patent is extended or adjusted under 35 U.S.C. 154(b) by 182 days.

(21) Appl. No.: 18/146,167

(22) Filed: Dec. 23, 2022

(65) Prior Publication Data

US 2024/0177782 A1     May 30, 2024

(30) Foreign Application Priority Data

Nov. 30, 2022  (KR) .......................... 10-2022-0164995

(51) Int. Cl.
| | |
|---|---|
| G11C 11/413 | (2006.01) |
| G11C 11/419 | (2006.01) |
| G11C 16/04 | (2006.01) |
| G11C 16/30 | (2006.01) |
| G11C 16/34 | (2006.01) |

(52) U.S. Cl.
CPC ........ *G11C 16/3459* (2013.01); *G11C 11/413* (2013.01); *G11C 11/419* (2013.01); *G11C 16/0433* (2013.01); *G11C 16/30* (2013.01)

(58) Field of Classification Search
CPC . G11C 11/413; G11C 11/419; G11C 16/0433; G11C 16/30; G11C 16/3459
See application file for complete search history.

(56) References Cited

U.S. PATENT DOCUMENTS

| | | | |
|---|---|---|---|
| 9,496,027 B2 * | 11/2016 | Rim | ...................... G11C 11/419 |
| 9,741,410 B2 | 8/2017 | Chen et al. | |
| 9,779,802 B1 * | 10/2017 | Chang | .................. G11C 7/1096 |

FOREIGN PATENT DOCUMENTS

| | | |
|---|---|---|
| KR | 10-2016-0019594 A | 2/2016 |
| KR | 10-2232922 B1 | 3/2021 |

\* cited by examiner

*Primary Examiner* — Son L Mai
(74) *Attorney, Agent, or Firm* — BROADVIEW IP LAW, PC

(57) ABSTRACT

According to an exemplary embodiment of the present disclosure, a static random access memory apparatus which stably maintains the writing performance in a low-power environment is applied to determine whether a writing performance of the SRAM is degraded based on a voltage difference of a first bit line and a second bit line connected to a memory cell and triggers an operation of the writing performance assist circuit of the SRAM.

14 Claims, 9 Drawing Sheets

STATIC RANDOM ACCESS MEMORY APPARATUS THAT MAINTAINS STABLE WRITE PERFORMANCE IN LOW POWER ENVIRONMENT

CROSS-REFERENCE TO RELATED APPLICATIONS

This application claims priority to and the benefit of Korean Patent Application No. 10-2022-0164995 filed in the Korean Intellectual Property Office on Nov. 30, 2022, the entire contents of which are incorporated herein by reference.

TECHNICAL FIELD

The present disclosure relates to a static random access memory apparatus, and more particularly, to a static random access memory apparatus which stably maintains write performance. The present patent application has been filed as research projects as described below.

[1] National Research Development Project supporting the Present Invention
  Project Serial No. 1711174145
  Project No.: RS-2022-00156225
  Department: Ministry of Science and ICT
    Project management (Professional) Institute: Institute of Information & Communication Technology Planning & Evaluation
    Research Project Name: Ministry of Science and ICT Information Technology Research Center (ITRC) incubation project
    Research Task Name: Research and development of neuro-chip design technology and neuro-computing platform mimicking human nervous system
    Contribution Ratio: 100%
    Project Performing Institution: Kwangwoon University Industry-Academic Collaboration Foundation
  Research Period: 2022.07.01~2022.12.31

BACKGROUND ART

The contents described in this section merely provide background information on the present exemplary embodiment but do not constitute the related art.

In accordance with the increase in the use of high-tech system such as mobile phones, computers, and autonomous vehicles and portable electronic devices, the use of the system on chip (SoC) is increasing.

Generally, a semiconductor memory apparatus is divided into a volatile memory and a nonvolatile memory depending on whether data is retained when an external power is shut off. As the volatile memory in which the data is not retained due to the shut-off of the external power, there are SRAM and DRAM.

The SRAM is one of memories which are necessarily used in the SoC. A unit cell of the SRAM is configured by a flip-flop circuit and two switches and data is stored by the feedback effect of the flip-flop as long as the power is applied. A unit cell of the DRAM is configured by a cell-transistor which serves as a switch and a capacitor which serves to store data input through the turned-on cell transistor in a cell capacitor.

The memory cell of the static random access memory (SRAM) device may not ensure a stable writing operation in a low voltage or high density environment. Accordingly, the SRAM device generally requires various types of write assist circuits which assist a writing operation. The write assist circuit may temporally adjust a voltage applied to the memory cell during the writing operation to be more advantageous for the writing operation, but the power is excessively used so that there is a problem in that it is not appropriate to be used in a low power environment.

Accordingly, a technology for determining whether the write performance is degraded based on voltages of bit lines connected to the memory cell and operating the write assist circuit only when the write performance is degraded needs to be studied and developed.

(Patent Document 1) Korean Registered Patent No. 10-2232922 (Mar. 22, 2021)

SUMMARY

An object to be achieved by the present disclosure is to provide a static random access memory apparatus which determines whether a write performance of the SRAM is degraded based on a voltage difference of a first bit line and a second bit line connected to a memory cell and stably maintains the write performance in the low-power environment which triggers an operation of the write performance assist circuit of the SRAM.

Other and further objects of the present invention which are not specifically described can be further considered within the scope easily deduced from the following detailed description and the effect.

In order to achieve the above-described objects, according to an aspect of the present disclosure, a static random access memory apparatus includes a memory cell which is connected to a first bit line through a second bit line which is different from the first bit line; a write fail detecting unit which outputs a write fail signal based on a difference between a first voltage applied to the first bit line and a second voltage applied to the second bit line; and a voltage generator which adjusts the first voltage or the second voltage in response to the write fail signal.

The write fail detecting unit includes: a first switching transistor which switches the first bit line in response to receiving a first selection signal; and a second switching transistor which switches the second bit line in response to receiving the first selection signal.

The write fail detecting unit further includes: a first transistor which is electrically connected to the first switching transistor via a first node; and a second transistor which is electrically connected to the second switching transistor via a second node.

A source terminal of the second transistor is electrically connected to a source terminal of the first transistor, a drain terminal is electrically connected to a drain terminal of the first transistor, and a gate terminal is electrically connected to the second node and a gate terminal of the first transistor is electrically connected to the first node.

The write fail detecting unit further includes: a third node which is electrically connected to a source terminal of the first transistor and the source terminal of the second transistor; and a coupling capacitor which is electrically connected to the third node to pre-charge the third node.

The write fail detecting unit further includes: a fourth node which is applied with an overdrive enable signal; and a third transistor having a drain terminal electrically connected to the third node and a gate terminal electrically connected to the fourth node.

The write fail detecting unit further includes: a first inverter having an input terminal electrically connected to the fourth node; a fifth node which is electrically connected to an output terminal of the first inverter; and a second inverter having an input terminal electrically connected to the fifth node and an output terminal electrically connected to the coupling capacitor.

The write fail detecting unit further includes: a fourth transistor having a gate terminal electrically connected to the fifth node; and a fifth transistor having a source terminal electrically connected to the drain terminal of the fourth transistor.

The write fail detecting unit further includes: a third inverter having an output terminal electrically connected to a gate terminal of the fifth transistor via a sixth node and an input terminal electrically connected to a drain terminal of the fifth transistor via a seventh node.

The write fail detecting unit outputs the write fail signal through an eighth node which is electrically connected to the drain terminal of the first transistor and the drain terminal of the second transistor and the eighth node is electrically connected to the seventh node.

The write fail detecting unit further includes: a sixth transistor having a source terminal electrically connected to the eighth node and a drain terminal electrically connected to a ground power source.

The third node is electrically connected to a ground power source via a first capacitor.

The first switching transistor includes: a 1-1-st switching transistor which receives a first selection signal through a gate terminal; and a 1-2-nd switching transistor which receives a second selection signal through a gate terminal and the second switching transistor includes: a 2-1-st switching transistor which receives a first selection signal through a gate terminal; and a 2-2-nd switching transistor which receives a second selection signal through a gate terminal.

Here, the static random access memory apparatus further includes a write driver which floats one of the first bit line and the second bit line or applies a write voltage to one of the first bit line and the second bit line in response to a logic state of a data signal.

As described above, according to an exemplary embodiment of the present disclosure, a static random access memory apparatus which stably maintains the write performance in a low-power environment is applied to determine whether a write performance of the SRAM is degraded based on a voltage difference of a first bit line and a second bit line connected to a memory cell and triggers an operation of the write performance assist circuit of the SRAM.

Even if the effects are not explicitly mentioned here, the effects described in the following specification which are expected by the technical features of the present disclosure and their potential effects are handled as described in the specification of the present disclosure.

DETAILED DESCRIPTION OF THE EMBODIMENT

Figure 1:
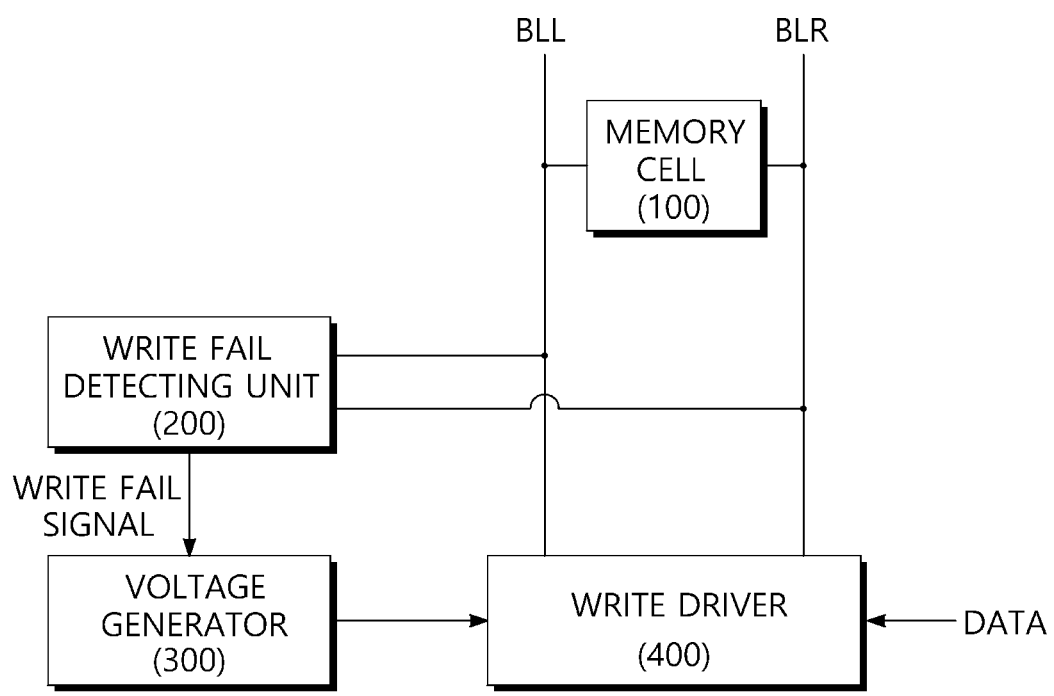
FIG. 1 is a view for explaining a configuration of a static random access memory apparatus which stably maintains a write performance in a low power environment according to an exemplary embodiment of the present disclosure.

It should be understood that both the foregoing general description and the following detailed description are illustrative, and are to be considered as providing additional explanation of the claimed invention. Reference numerals are denoted in detail in the exemplary embodiments of the present disclosure and examples thereof are denoted on the reference drawings. In any possible cases, the same reference numerals are used for the description and the drawings to refer to the same or like parts.

Hereinafter, a semiconductor device or a semiconductor chip are used as examples of units for describing a feature and a function of the present disclosure. However, those skilled in the art will easily understand other advantages and performances of the present disclosure in light of the disclosure herein. The present disclosure may also be implemented or applied through other exemplary embodiments. In addition, the detailed description will be modified or changed according to viewpoints and applications without significantly departing from the scope, the spirit, and other object of the present disclosure.

Various exemplary embodiments of the static random access memory apparatus (hereinafter, referred to as a static random access memory apparatus) which stably maintains the write performance in a low power environment according to the present disclosure will be described in detail with reference to the accompanying drawings.

Exemplary embodiments disclosed in the present specification may be applied to the static random access memory (SRAM) and applied to various types of electronic devices including the SRAM, such as mobile phones, wireless earphones, IoT home appliances, computers, and autonomous vehicles.

FIG. 1 is a view for explaining a configuration of a static random access memory apparatus which stably maintains a write performance in a low power environment according to an exemplary embodiment of the present disclosure.

Referring to FIG. 1, a static random access memory apparatus 10 includes a memory cell 100, a write fail detecting unit 200, a voltage generator 300, and a write driver 400.

The memory cell 100 is connected to a first bit line BLL through a second bit line BLR which is different from the first bit line.

The write driver 400 writes data in the memory cell 100 according to a data signal DATA.

The write driver 400 may float any one bit line of the first bit line BLL and the second bit line BLR in response to the data signal DATA. The write driver 400 may apply a write voltage to any one bit line of the first bit line BLL and the second bit line BLR.

The write driver 400 may apply a write voltage to any one bit line of the first bit line BLL and the second bit line BLR.

For example, when data signal DATA is a logic high state signal, the first bit line BLL is floated and a write voltage is applied to the second bit line BLR.

Here, a voltage level of the floated bit line may be a logic high state voltage and a write voltage level may be a logic low state voltage.

The write fail detecting unit 200 may detect the failure of the writing operation by the write driver 400 to output a write fail signal WF.

The write fail detecting unit 200 outputs a write fail signal WF in response to a change in a voltage level of the floated bit line. To be more specific, the write fail detecting unit 200 operates based on a difference between a first voltage applied to the first bit line and a second voltage applied to the second bit line to output a write fail signal.

The write fail detecting unit 200 may output a write fail signal in response to the reduction of the difference of the first voltage and the second voltage. The write fail detecting unit 200 outputs a write fail signal in response to the reduction of the difference of the first voltage and the second voltage since a decreasing degree of the first voltage is smaller than that of the second voltage.

When a logic state of a voltage of the floated bit line is changed during a writing operation, the write fail detecting unit 200 outputs a logic high state write fail signal WF. Here, the logic high state write fail signal WF represents a state that the writing operation fails or the performance of the writing operation is insufficient.

When the writing operation fails, the voltage generator 300 outputs a write assist voltage NVSS. The voltage generator 300 may adjust a first voltage or a second voltage in response to the write fail signal. The voltage generator 300 performs a write assist operation in various known methods.

The voltage generator 300 generates a write assist voltage NVSS in response to the write fail signal WF. For example, when the write fail signal WF is a logic high state signal, the voltage generator 300 may generate a write assist voltage NVSS. Here, the write assist voltage NVSS may be a negative voltage which is lower than a logic low state write voltage, but is not necessarily limited thereto. A generated write assist voltage NVSS is additionally supplied to a bit line to which a write voltage is applied, through a write driver 400 to assist the writing operation.

All blocks illustrated in FIG. 1 are not essential components and some blocks connected to the static random access memory apparatus 10 may be added, changed, or deleted in another exemplary embodiment.

Figure 2:
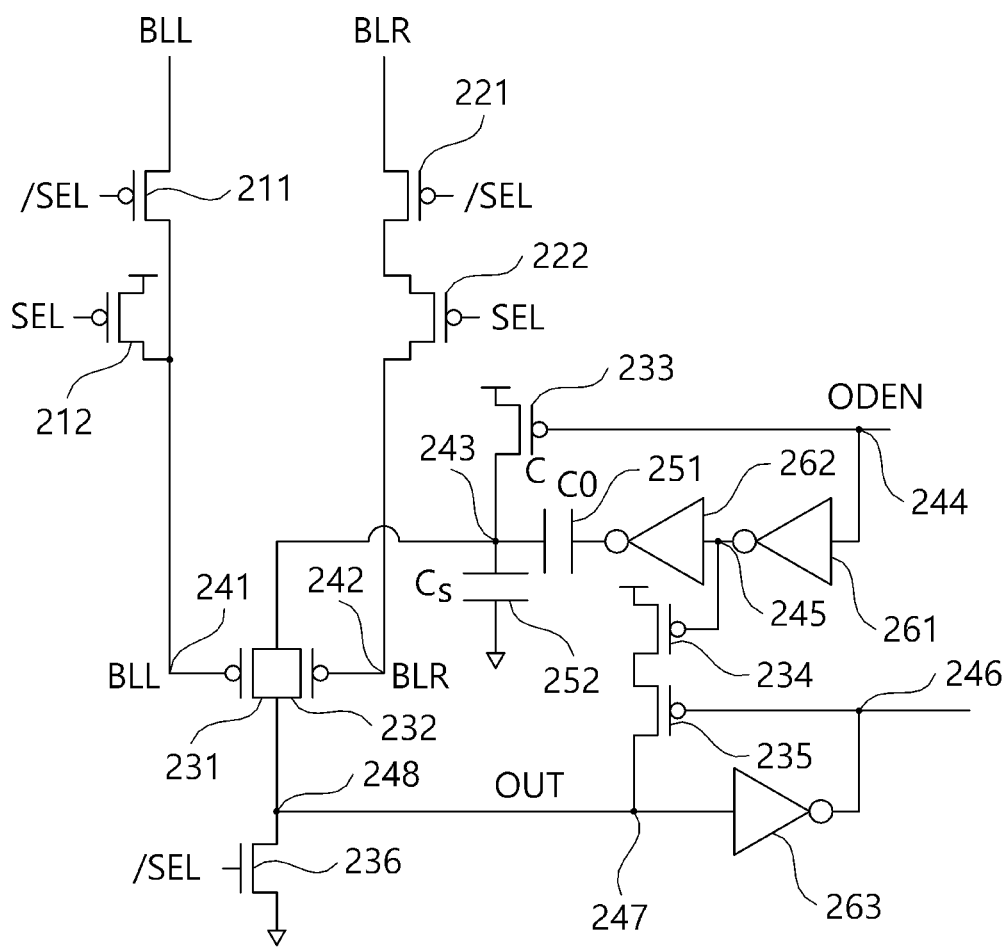
FIG. 2 is a view for explaining a configuration of a write fail detecting unit of a static random access memory apparatus which stably maintains a write performance in a low power environment according to an exemplary embodiment of the present disclosure.

FIG. 2 is a view for explaining a configuration of a write fail detecting unit of a static random access memory apparatus which stably maintains a write performance in a low power environment according to an exemplary embodiment of the present disclosure.

Referring to FIG. 2, the write fail detecting unit 200 includes first switching transistors 211 and 212 and second switching transistors 221 and 222.

The first switching transistors 211 and 212 switch a first bit line in response to reception of a first selection signal.

The first switching transistors 211 and 212 may include a 1-1-st switching transistor 211 and a 1-2-nd switching transistor 212.

The 1-1-st switching transistor 211 receives the first selection signal through a gate terminal.

The 1-2-nd switching transistor 212 receives a second selection signal through the gate terminal.

The second switching transistors 221 and 222 switch a second bit line in response to reception of a first selection signal.

The second switching transistors 221 and 222 may include a 2-1-st switching transistor 221 and a 2-2-nd switching transistor 222.

The 2-1-st switching transistor 221 receives the first selection signal through the gate terminal.

The 2-2-nd switching transistor 222 receives a second selection signal through the gate terminal.

The 1-1-st switching transistor and the 2-1-st switching transistor 211 and 221 (MPL/R, Mosfet PMOS left/right) operate as a switch to connect the bit line and the write fail detecting unit 200.

The 1-2-nd switching transistor and the 2-2-nd switching transistor 212 and 222 (MPCHL/R, Mosfet Pre Charge left/right) operate as a voltage source to maintain VDD before the write fail detecting unit 200 is turned on.

Referring to FIG. 2, the second selection signal (/SEL) may be an inverted signal of the first selection signal SEL.

The write fail detecting unit 200 further includes a first node 241, a second node 242, a first transistor 231, and a second transistor 232.

The first transistor 231 is electrically connected to the first switching transistors 211 and 212 via the first node 241.

The second transistor 232 is electrically connected to the second switching transistors 221 and 222 via the second node 242.

A source terminal of the second transistor 232 is electrically connected to a source terminal of the first transistor 231, a drain terminal is electrically connected to a drain terminal of the first transistor 231, and a gate terminal is electrically connected to a second node 232.

A gate terminal of the first transistor 231 may be electrically connected to the first node 241.

Gate terminals of the first transistor 231 and the second transistor 232 (MPDL/R, Mosfet PMOS detecting Left/Right) are connected to the first bit line and the second bit line to perform a detecting function. For example, the first transistor 231 and the second transistor 232 detect a first voltage and a second voltage, respectively, and the first transistor 231 and the second transistor 232 detect the difference between the first voltage and the second voltage as a whole.

The write fail detecting unit 200 further includes a third node 243 and a coupling capacitor (CC0) 251.

The third node 243 is electrically connected to a source terminal of the first transistor 231 and a source terminal of the second transistor 232.

The coupling capacitor (CC0) 251 is electrically connected to the third node 243 to pre-charge the third node 243.

The write fail detecting unit 200 further includes a fourth node 244 and a third transistor 233.

The fourth node 244 is applied with an overdrive enable signal ODEN.

A drain terminal of the third transistor 233 is electrically connected to the third node 243 and a gate terminal is electrically connected to the fourth node 244.

The third transistor 233 (MH, Mosfet High) operates as a voltage source to make the third node 243 VDDH.

The write fail detecting unit 200 further includes a first inverter 261, a second inverter 262, and a fifth node 245.

An input terminal of the first inverter 261 may be electrically connected to the fourth node 244.

The fifth node 245 is electrically connected to an output terminal of the first inverter 261.

An input terminal of the second inverter 262 is electrically connected to the fifth node 245 and an output terminal is electrically connected to the coupling capacitor 251.

The write fail detecting unit 200 further includes a fourth transistor 234 and a fifth transistor 235.

A gate terminal of the fourth transistor 234 may be electrically connected to the fifth node 245. The fourth transistor 234 (MP1, Mosfet PMOS1) prevents an output of the write fail detecting unit 200 from outputting a value unrelated to the write fail detecting unit 200.

A source terminal of the fifth transistor 235 may be electrically connected to the drain terminal of the fourth transistor 234. The fifth transistor 235 (MP2, Mosfet PMOS2) serves to assist to smoothly increase the output as a positive feedback.

The write fail detecting unit 200 further includes a sixth node 246, a seventh node 247, and a third inverter 263.

An output terminal of the third inverter 263 is electrically connected to a gate terminal of the fifth transistor 235 through the sixth node 246 and an input terminal is electrically connected to a drain terminal of the fifth transistor 235 through the seventh node 247.

The write fail detecting unit 200 further includes an eighth node 248 and a sixth transistor 236.

The eighth node 248 is electrically connected to a drain terminal of the first transistor 231 and a drain terminal of the second transistor 232 and the write fail detecting unit 200 outputs a write fail signal OUT through the eighth node 248. The eighth node 248 may be electrically connected to the seventh node 247. The write fail signal OUT is transmitted to the voltage generator 300 through the seventh node 247, the third inverter 263, and the sixth node 246.

A source terminal of the sixth transistor 236 may be electrically connected to the eighth node 248 and a drain terminal may be electrically connected to a ground power.

When VDDH of the third node 243 is higher than VDD+Vthp until the selection signal is enabled, the sixth transistor 236 (MN0, Mosfet NMOS 0) discharges the charges to maintain VDD+Vthp.

The write fail detecting unit 200 further includes a first capacitor 252.

The third node 243 is electrically connected to the ground power through the first capacitor 252.

Figure 3:
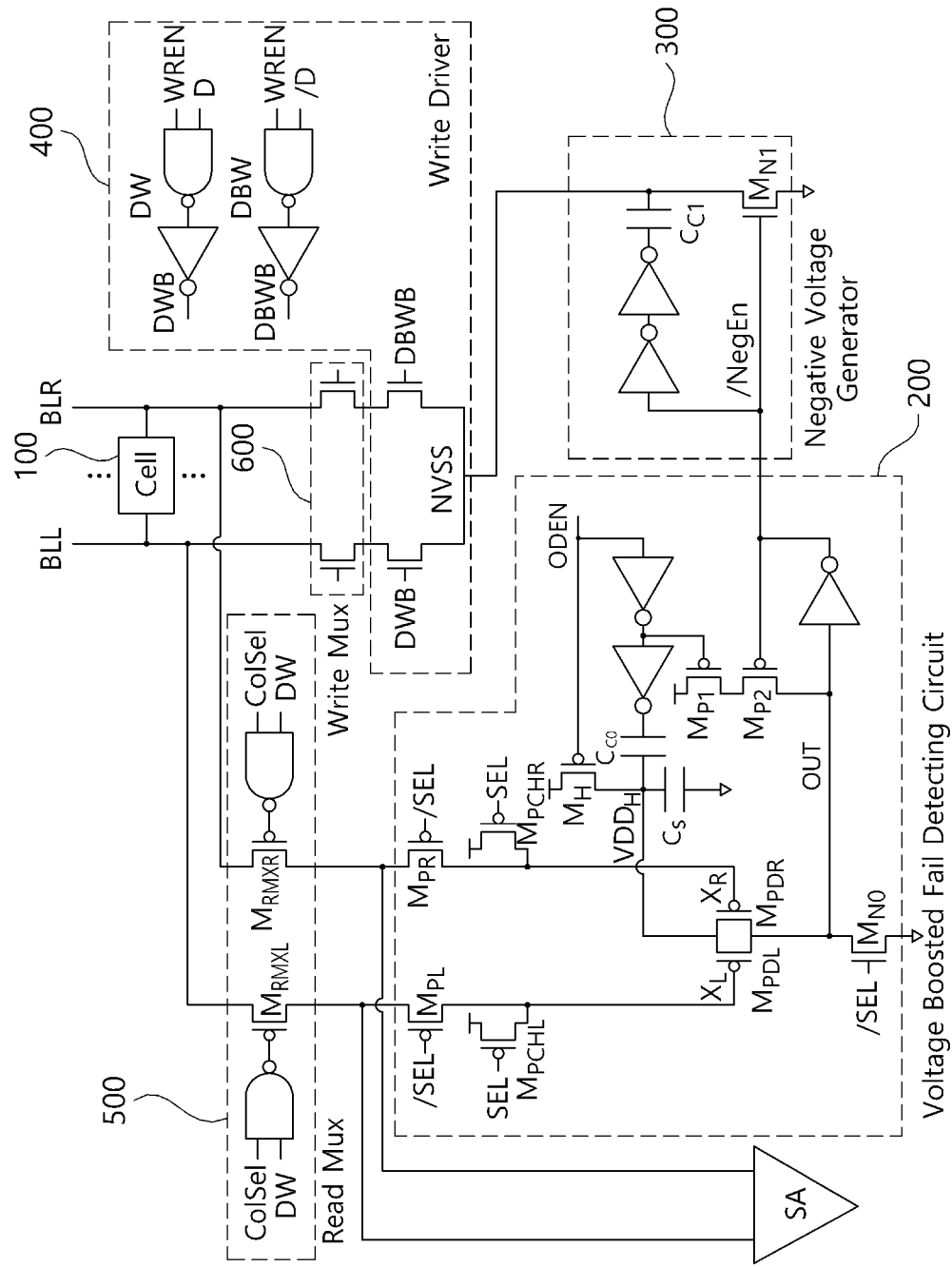
FIG. 3 is a view for explaining a configuration of a static random access memory apparatus which stably maintains a write performance in a low power environment according to another exemplary embodiment of the present disclosure.

FIG. 3 is a view for explaining a configuration of a static random access memory apparatus which stably maintains a write performance in a low power environment according to another exemplary embodiment of the present disclosure.

In order to solve an energy overhead problem of a write assist circuit of the related art, the present disclosure provides a selective writing operation assist circuit which reads a write success or a write fail from a bit line state to trigger a voltage generator (for example, a negative voltage generator) only when the writing operation fails to consume a minimum energy.

Referring to FIG. 3, the memory cell 100 is electrically connected to the write fail detecting unit 200 through a read MUX 500. The memory cell 100 is electrically connected to the write driver 400 through the write MUX 600.

The write MUX 500 (MRMXL/R, Mosfet Read MUX left/right) turns on/off the memory cell 100 or the bit line in response to whether to perform the reading operation or the writing operation. The read MUX 500 includes a NAND gate.

CC1 is set to 14f which is a cap size to satisfy a write yield of 66. The coupling capacitor CC0 and the first capacitor CS have a trade-off relationship that the larger the value, the better the write yield, but the larger the write assist ratio. Accordingly, in consideration thereof, a cap size may be set (for example, CC0=1.5f and CS=1.5f).

Further, in consideration of additional leakage, the MH may be designed as a low voltage threshold (LVT) and MPDs are designed as a regular voltage threshold (RVT).

Figure 4:
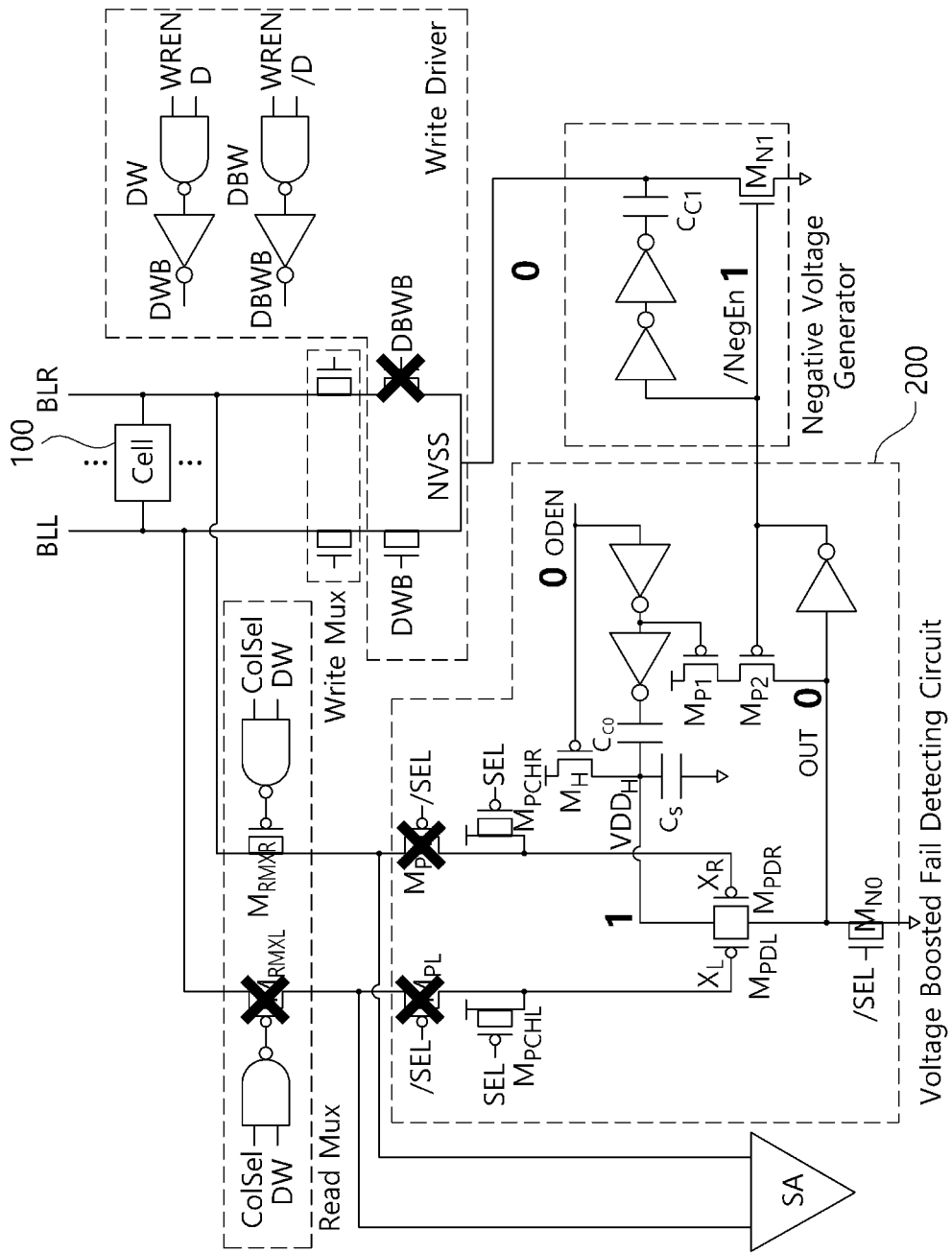
FIG. 4 is a view for explaining that a static random access memory apparatus which stably maintains a write performance in a low power environment of FIG. 3 operates in a standby state.

FIG. 4 is a view for explaining that a static random access memory apparatus which stably maintains a write performance in a low power environment of FIG. 3 operates in a standby state.

The operation of the present disclosure is divided into a write fail and a write success in the writing operation and may be divided into write assist or no-write assist according to the operation result of the bit cell 100. However, for better understanding, the standby state will be additionally described with reference to FIG. 4.

Referring to FIG. 4, in the standby state, in the write fail detecting unit 200, the overdrive enable signal ODEN is 0, a selection signal (SEL) is 0, and the third node 243 (VDDH) is also VDD which is a standby state. The first bit line BLR is floated and the second bit line BLL is pulled down to be 0.

Figure 5:
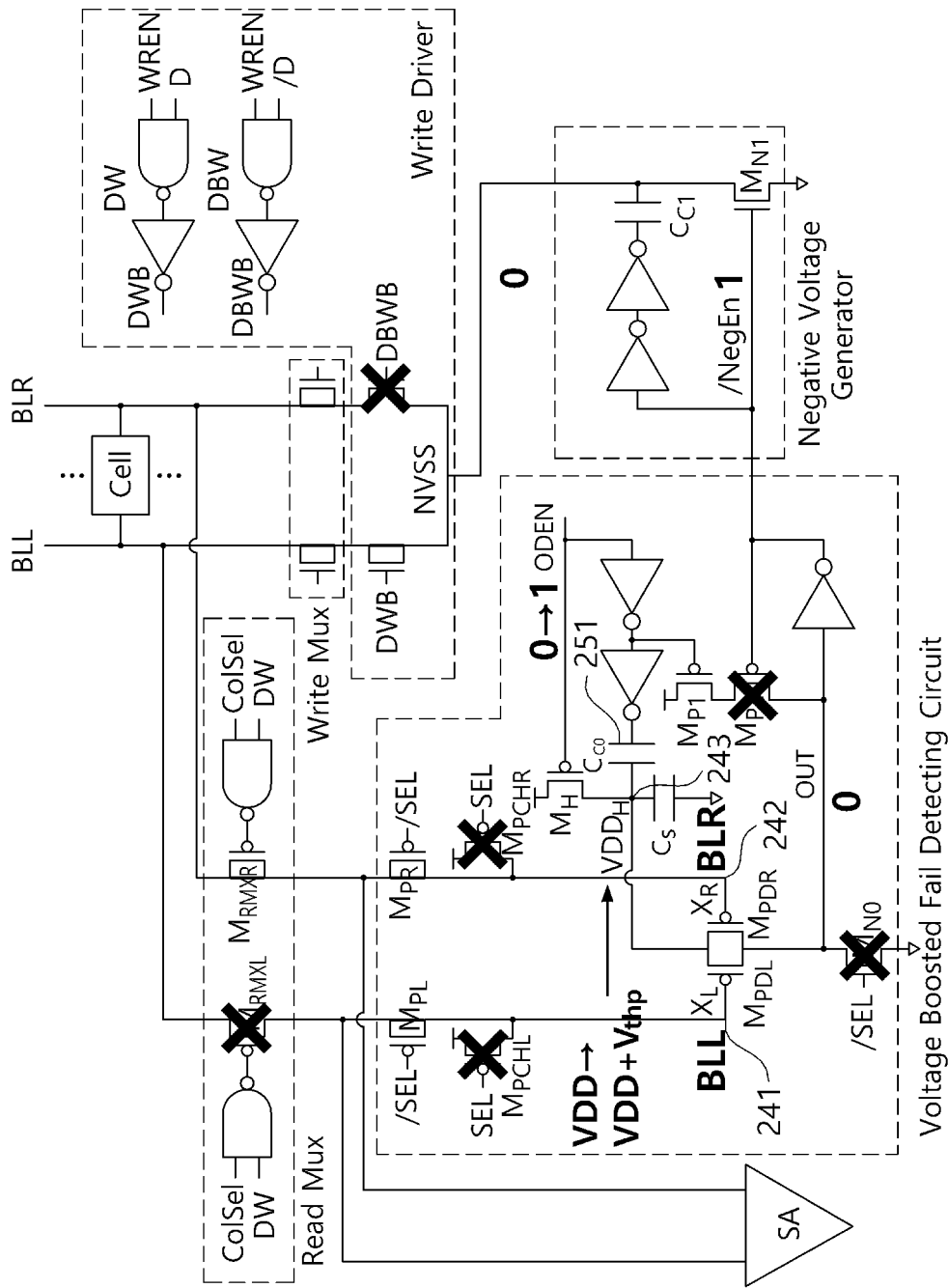
FIG. 5 is a view for explaining that a static random access memory apparatus which stably maintains a write performance in a low power environment of FIG. 3 successfully performs a writing operation.

FIG. 5 is a view for explaining that a static random access memory apparatus which stably maintains a write performance in a low power environment of FIG. 3 successfully performs a writing operation.

Referring to FIG. 5, after elapsing a predetermined time after the overdrive enable signal is pulled up from 0 to 1, if the selection signal SEL is pulled up from 0 to 1, the first node (XL) 241 is connected to the first bit line BLL and the second node (XR) 242 is connected to the second bit line BLR.

The third node 243 (VDDH) is pre-charged with VDD+|Vthp, MPD| by the overdrive enable signal and the coupling capacitor 251 (CC0).

That is, the first inverter 261, the second inverter 262, the coupling capacitor 251, and the third transistor 233 serve to boost the third node 243 to a VDD voltage or higher.

When the write succeeds, the first bit line BLL is 0 and the second bit line BLR has a VDD level value so that |VGS| of the second node (XR) 242 is |Vthp| and almost no current flows.

Accordingly, the write fail signal OUT is maintained to 0 and thus, /NegEN and the write assist voltage NVSS are maintained as it is and a write assist operation is not generated.

Figure 6:
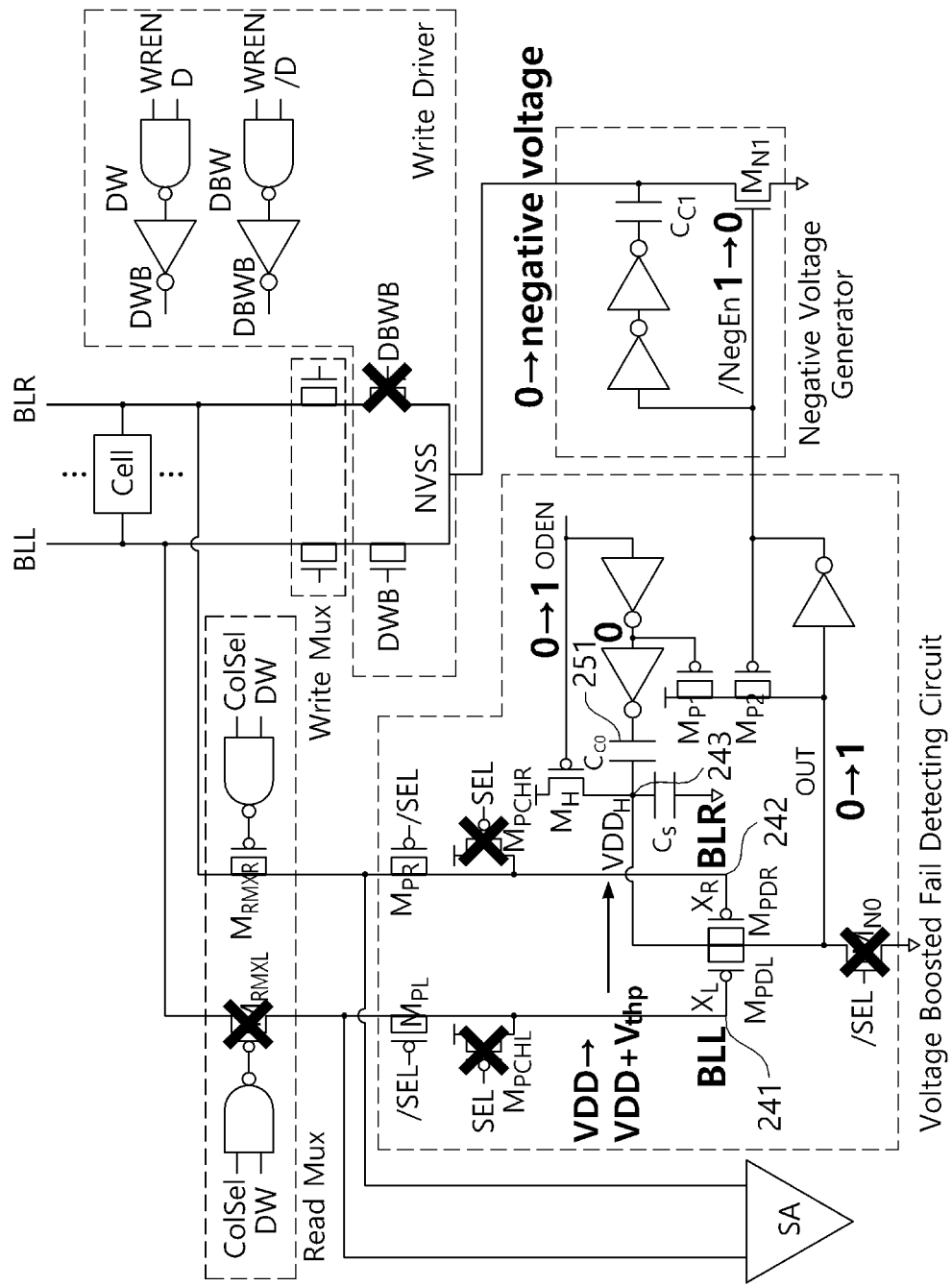
FIG. 6 is a view for explaining that a static random access memory apparatus which stably maintains a write performance in a low power environment of FIG. 3 fails a writing operation.

FIG. 6 is a view for explaining that a static random access memory apparatus which stably maintains a write performance in a low power environment of FIG. 3 fails a writing operation.

Referring to FIG. 6, after passing a predetermined time after the overdrive enable signal is pulled up from 0 to 1, if the selection signal SEL is pulled up from 0 to 1, the first node (XL) 241 is connected to the first bit line BLL and the second node (XR) 242 is connected to the second bit line BLR.

The third node 243 (VDDH) is pre-charged with VDD+ |Vthp, MPD| by the overdrive enable signal and the coupling capacitor 251 (CC0).

When the write fails, the first bit line BLL is 0 and the second bit line BLR is continuously discharged from the VDD to the ground power GND so that the second node (XR) 242 is |VGS|>Vthp| and |VGS| is gradually increased while discharging the second bit line BLR until the write succeeds.

Accordingly, the write fail signal OUT is pulled up from 0 to 1 and thus, /NegEN is pulled down from 1 to 0, and the write assist voltage NVSS is overdriven to a negative voltage by the capacitor coupling. Accordingly, the second bit line BLL is also overdriven to the negative voltage and the write assist operation is performed.

Figure 7:
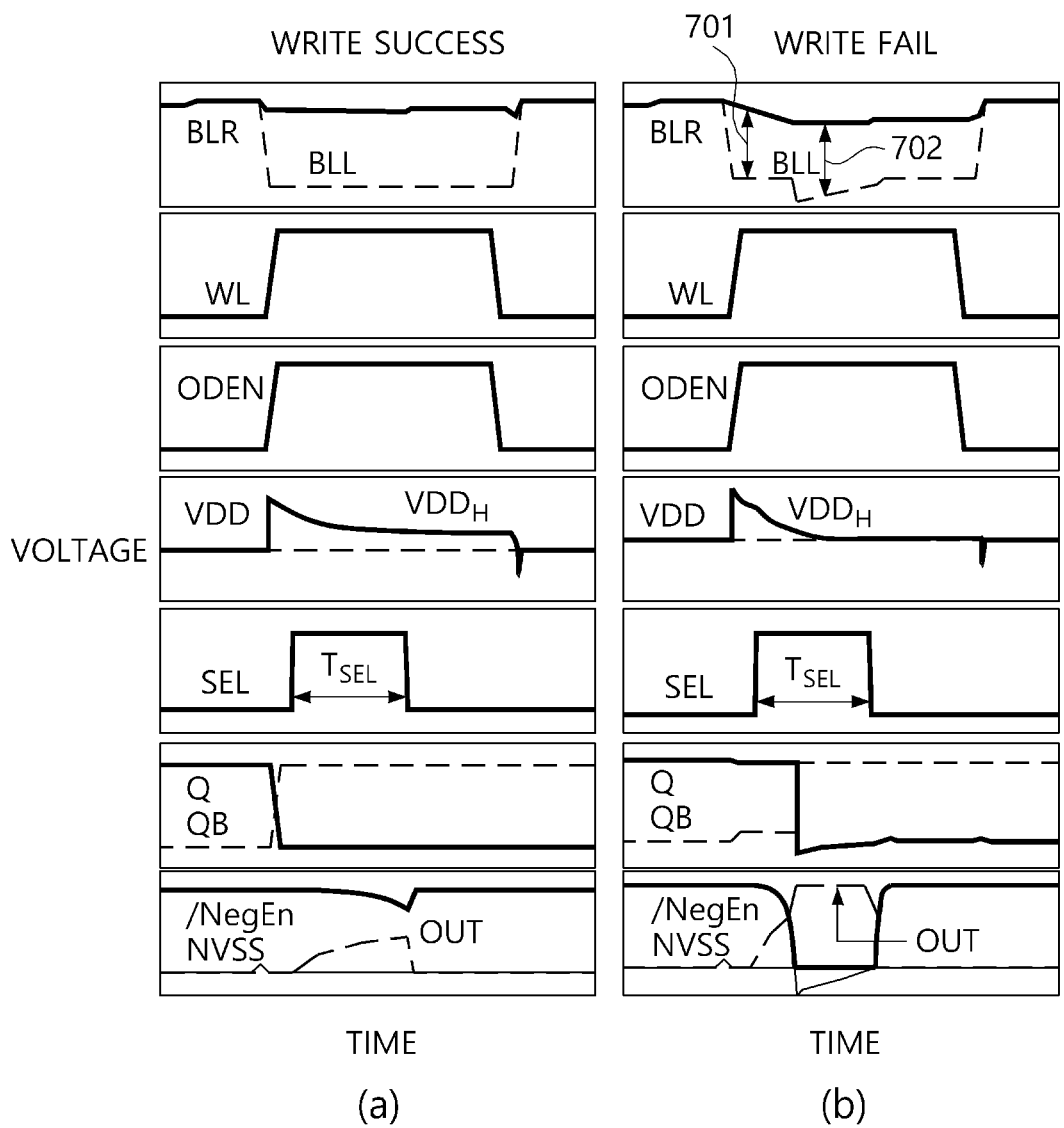
FIG. 7 is a view illustrating operation waveforms of a static random access memory apparatus which stably maintains a write performance in a low power environment according to another exemplary embodiment of the present disclosure.

FIG. 7 is a view illustrating operation waveforms of a static random access memory apparatus which stably maintains a write performance in a low power environment according to another exemplary embodiment of the present disclosure.

FIG. 7A is a view illustrating operation waveforms when the writing operation of the present disclosure succeeds without the assistance of the voltage generator 300 and FIG. 7B is a view illustrating operation waveforms when the writing operation fails to operate the write fail detecting unit 200 and the voltage generator 300.

From the reference numeral 701 of FIG. 7, it is confirmed that the voltage of the second bit line BLR drops, but the voltage of the first bit line BLL is relatively constantly maintained. The write fail detecting unit 200 operates in response to the reduction of the difference of the voltage of the second bit line BLR and the voltage of the first bit line BLL to transmit a write fail signal to the voltage generator 300. The voltage generator 300 generates a negative voltage to assist the writing operation of the SRAM by lowering a voltage of the first bit line BLL as indicated by the reference numeral 702.

Figure 8:
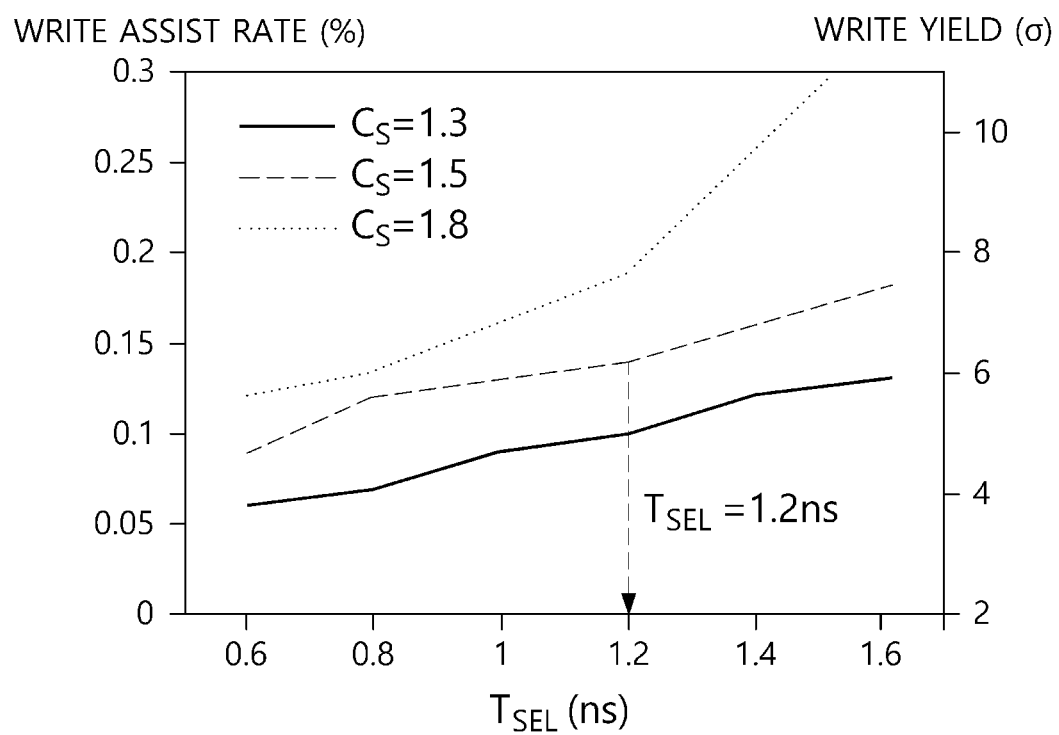
FIG. 8 illustrates a write assist rate and a write yield according to Tsel and a capacitance of a first capacitor of a static random access memory apparatus which stably maintains a write performance in a low power environment according to another exemplary embodiment of the present disclosure.

FIG. 8 illustrates a write assist rate and a write yield according to Tsel and a capacitance of a first capacitor of a static random access memory apparatus which stably maintains a write performance in a low power environment according to another exemplary embodiment of the present disclosure.

Figure 9:
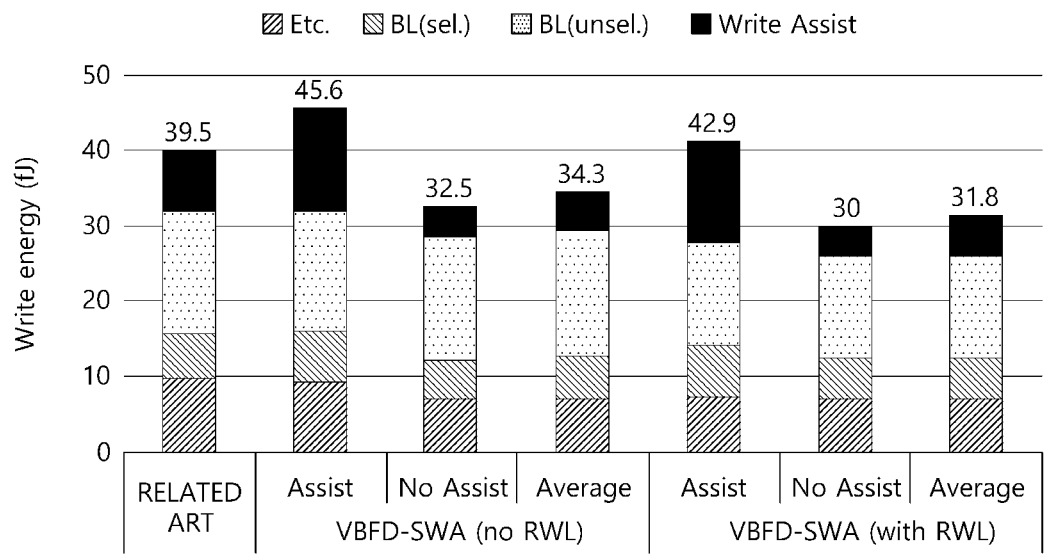
FIG. 9 is a view for comparing a consumed energy amount of a write fail detecting unit of a static random access memory apparatus which stably maintains a write performance in a low power environment according to an exemplary embodiment of the present disclosure and a consumed energy amount of a related art.

FIG. 9 is a view for comparing a consumed energy amount of a write fail detecting unit of a static random access memory apparatus which stably maintains a write performance in a low power environment according to an exemplary embodiment of the present disclosure and a consumed energy amount of a related art.

As illustrated in FIG. 9, when the present disclosure is applied as compared with the related art (Conv. NBL, conventional negative bit line), it is understood that a during the writing operation, approximately 19.4% of the power may be conserved.

The static random access memory apparatus 10 according to the present disclosure may reduce the length of the word line WL through a read operation result. A reduced word line of FIG. 9 means a word line reduced as a writing operation result of the static random access memory apparatus 10 according to the present disclosure.

The energy overhead problem of the write assist circuit of the related art may be solved by applying the present disclosure.

The present disclosure includes a structure of performing the voltage boosting using the capacitance coupling and is energy-efficient and is available at a low voltage.

Accordingly, the present disclosure is applied to the SRAM in a low voltage environment and an energy efficiency of an integrated circuit may be increased.

Figure 10:
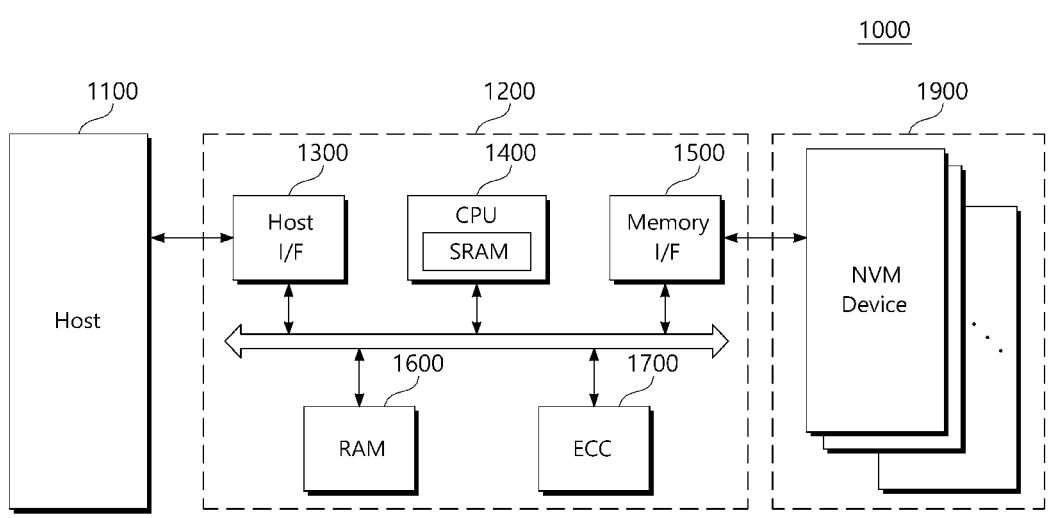
FIG. 10 is a block diagram illustrating a user device including a static random access memory apparatus according to an exemplary embodiment of the present disclosure.

FIG. 10 is a block diagram illustrating a user device including a static random access memory apparatus according to an exemplary embodiment of the present disclosure.

Referring to FIG. 10, a user device 1000 includes a memory controller 1200 and a nonvolatile memory apparatus 1900.

The memory controller 1200 is connected to a host 1100 and nonvolatile memory apparatuses 1900. The memory controller 1200 is configured to access the nonvolatile memory apparatuses 1900 in response to a request from the host 1100. For example, the memory controller 1200 is configured to control read, write, and erase operations of the nonvolatile memory apparatuses 1900. The memory controller 1200 is configured to provide the interface between the nonvolatile memory apparatuses 1900 and the host 1100. The memory controller 1200 is configured to drive a firmware for controlling the nonvolatile memory apparatuses 1900.

The memory controller 1200 may include well-known components such as a RAM, a central processing unit (CPU), a host interface, an error correction code (ECC), and a memory interface. The central processing unit 1400 includes the static random access memory apparatus 1450 according to the exemplary embodiment of the present disclosure.

The RAM 2600 is used as a working memory of the central processing unit 1400. The static random access memory apparatus 1450 is used as a cache memory of the central processing unit 1400. The central processing unit 1400 controls the entire operation of the memory controller 1200.

The host interface 1300 includes a protocol for performing a data exchange between the host 1100 and the memory controller 1200. For example, the memory controller 1200 is configured to communicate with the outside (for example, a host) through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA (SATA) protocol, a small computer small interface (SCSI) protocol, an enhanced small disk interface (ESDI) protocol, and an integrated drive electronics (IDE) protocol.

The error correction block 1700 is configured to detect and correct errors of data read from the nonvolatile memory apparatuses 1900. The error correction block 1700 may be provided as a component of the memory controller 1200. As another example, the error correction block 1700 may be provided as components of the nonvolatile memory apparatuses 1900.

The memory interface 1500 interfaces the nonvolatile memory apparatuses 1900 and the memory controller 1200.

It is well understood that the components of the memory controller 1200 are not limited to the above-mentioned components. For example, the memory controller 1200 may further include a read only memory (ROM) which stores code data required for an initial booting operation and data for interfacing with the host 1100.

The memory controller 1200 and the nonvolatile memory apparatuses 1900 may be integrated as one semiconductor device to configure a memory card. For example, the memory controller 1200 and the nonvolatile memory apparatuses 1900 are integrated as one semiconductor device to configure a personal computer memory card international association (PCMCIA) card, a compact flash (CF) card, a smart media card, a memory stick a multi media card (MMC, RS-MMC, MMC-micro), a secure digital card (SD, mini-SD, Micro-SD, SDHC), and a universal flash storage (UFS).

As another example, the memory controller 1200 and the nonvolatile memory apparatuses 1900 may be applied to a semiconductor drive (solid state drive, SSD), a computer, a portable computer, a ultra-mobile personal computer (UMPC), a work station, a netbook, a personal digital assistant (PDA), a web tablet, a wireless phone, a mobile phone, a digital camera, a digital audio recorder, a digital audio player, a digital video recorder, a digital video player, a device which transmits/receives information in a wireless environment, one of various electronic devices which configure a home network, one of various electronic devices which configure telematics network, one of various components which configure a computer system, a radio frequency identification (RFID) device, or an embedded system.

The central processing unit 1400 of the user device 1000 according to the exemplary embodiment of the present disclosure includes a static random access memory apparatus 1450 according to the exemplary embodiment of the present disclosure illustrated in FIG. 1 or 3. The static random access memory apparatus 1450 selectively performs the write assist operation only on a memory cell which fails the writing operation during the writing operation. To this end, the static random access memory apparatus 1450 includes the write fail detecting unit 200, the voltage generator 300, and the write driver 400 which are described above.

Even though it has been described above that all components of the exemplary embodiment of the present invention are combined as one component or operate to be combined, the present invention is not limited to the exemplary embodiment. In other words, one or more components may be selectively combined to be operated within a scope of the present invention.

The above description illustrates a technical spirit of the present invention as an example and various changes, modifications, and substitutions become apparent to those skilled in the art within a scope of an essential characteristic of the present invention. Therefore, the exemplary embodiments and accompanying drawings disclosed in the present invention do not limit, but describe the technical spirit of the present invention and the scope of the technical spirit of the present invention is not limited by the exemplary embodiments and accompanying drawings. The scope of the present invention may be interpreted by the appended claims and the technical spirit in the equivalent range is intended to be embraced by the invention.

What is claimed is:

1. A static random access memory apparatus, comprising:
   a memory cell which is connected to a first bit line through a second bit line which is different from the first bit line;
   a write fail detecting unit which outputs a write fail signal based on a difference between a first voltage applied to the first bit line and a second voltage applied to the second bit line; and
   a voltage generator which adjusts the first voltage or the second voltage in response to the write fail signal.

2. The static random access memory apparatus according to claim 1, wherein the write fail detecting unit includes:
   a first switching transistor which switches the first bit line in response to receiving a first selection signal; and
   a second switching transistor which switches the second bit line in response to receiving the first selection signal.

3. The static random access memory apparatus according to claim 2, wherein the write fail detecting unit further includes:
   a first transistor which is electrically connected to the first switching transistor via a first node; and
   a second transistor which is electrically connected to the second switching transistor via a second node.

4. The static random access memory apparatus according to claim 3, wherein a source terminal of the second transistor is electrically connected to a source terminal of the first transistor, a drain terminal is electrically connected to a drain terminal of the first transistor, and a gate terminal is electrically connected to the second node and a gate terminal of the first transistor is electrically connected to the first node.

5. The static random access memory apparatus according to claim 4, wherein the write fail detecting unit further includes:
   a third node which is electrically connected to a source terminal of the first transistor and the source terminal of the second transistor; and
   a coupling capacitor which is electrically connected to the third node to pre-charge the third node.

6. The static random access memory apparatus according to claim 5, wherein the write fail detecting unit further includes:
   a fourth node which is applied with an overdrive enable signal; and
   a third transistor having a drain terminal electrically connected to the third node and a gate terminal electrically connected to the fourth node.

7. The static random access memory apparatus according to claim 6, wherein the write fail detecting unit further includes:
   a first inverter having an input terminal electrically connected to the fourth node;
   a fifth node which is electrically connected to an output terminal of the first inverter; and
   a second inverter having an input terminal electrically connected to the fifth node and an output terminal electrically connected to the coupling capacitor.

8. The static random access memory apparatus according to claim 7, wherein the write fail detecting unit further includes:
   a fourth transistor having a gate terminal electrically connected to the fifth node; and
   a fifth transistor having a source terminal electrically connected to the drain terminal of the fourth transistor.

9. The static random access memory apparatus according to claim 8, wherein the write fail detecting unit further includes:
   a third inverter having an output terminal electrically connected to a gate terminal of the fifth transistor via a sixth node and an input terminal electrically connected to a drain terminal of the fifth transistor via a seventh node.

10. The static random access memory apparatus according to claim 9, wherein the write fail detecting unit outputs the write fail signal through an eighth node which is electrically connected to the drain terminal of the first transistor and the drain terminal of the second transistor and the eighth node is electrically connected to the seventh node.

11. The static random access memory apparatus according to claim 10, wherein the write fail detecting unit further includes:
a sixth transistor having a source terminal electrically connected to the eighth node and a drain terminal electrically connected to a ground power source.

12. The static random access memory apparatus according to claim 5, wherein the third node is electrically connected to a ground power source via a first capacitor.

13. The static random access memory apparatus according to claim 2, wherein the first switching transistor includes:
a 1-1-st switching transistor which receives a first selection signal through a gate terminal; and
a 1-2-nd switching transistor which receives a second selection signal through a gate terminal; and
the second switching transistor includes:
a 2-1-st switching transistor which receives a first selection signal through a gate terminal; and
a 2-2-nd switching transistor which receives a second selection signal through a gate terminal.

14. The static random access memory apparatus according to claim 1, further comprising:
a write driver which floats one of the first bit line and the second bit line or applies a write voltage to one of the first bit line and the second bit line in response to a logic state of a data signal.

* * * * *